(12) United States Patent
Haskell

(10) Patent No.: US 7,770,407 B1
(45) Date of Patent: Aug. 10, 2010

(54) FUEL CELL HAVING AN INTEGRATED, POROUS THERMAL EXCHANGE MECHANISM

(75) Inventor: Bert Haskell, Austin, TX (US)

(73) Assignee: Motion Computing, Inc., Austin, TX (US)

( * ) Notice: Subject to any disclaimer, the term of this patent is extended or adjusted under 35 U.S.C. 154(b) by 1348 days.

(21) Appl. No.: 11/061,701

(22) Filed: Feb. 18, 2005

(51) Int. Cl.
*F28C 1/00* (2006.01)
(52) U.S. Cl. ....................................... 62/315
(58) Field of Classification Search .............. 62/259.2, 62/315
See application file for complete search history.

(56) References Cited

U.S. PATENT DOCUMENTS

| | | | |
|---|---|---|---|
| 2,766,597 A * | 10/1956 | Gieck | 62/314 |
| 4,826,741 A | 5/1989 | Aldhart et al. | |
| 5,335,628 A | 8/1994 | Dunbar | |
| 5,358,799 A * | 10/1994 | Gardner | 429/26 |
| 6,666,909 B1 * | 12/2003 | TeGrotenhuis et al. | 95/273 |
| 6,835,483 B2 | 12/2004 | Ballantine et al. | |
| 6,841,250 B2 | 1/2005 | Tzeng | |
| 2004/0118142 A1 * | 6/2004 | Hsu et al. | 62/259.2 |

* cited by examiner

*Primary Examiner*—Melvin Jones
(74) *Attorney, Agent, or Firm*—Charles D. Huston; Daffer McDaniel, LLP

(57) ABSTRACT

A thermal transfer system, a heat sink, and a method for transferring heat are provided. The thermal transfer system includes a fuel cell that can produce a fluid. A wick is provided to transfer the fluid to a destination at which a heat source is present. An enclosure having a porous fluid-permeable external wall can surround the fluid at the destination. When the fluid permeates or condenses on the external wall exterior surface, air exposure of that external wall will cause evaporative cooling of the fluid, and thereby enhance the cooling effect at the heat source. The fluid is a natural byproduct of the fuel cell. Accordingly, the thermal transfer system not only cools a heat source, but produces electric current. The heat sink can be thermally coupled to the heat source, and can have a plurality of fins extending from a base. One or more fins can have a fluid-permeable external wall for evaporative cooling. Fluid can be transferred more efficiently using a wick placed somewhere within the internal radial dimension of a pipe that extends from the fuel cell to the heat source. The external wall of the pipe can also be porous to maximize the fluid entrapment on the inner surface and the evaporative cooling on the external surface.

11 Claims, 3 Drawing Sheets

FUEL CELL HAVING AN INTEGRATED, POROUS THERMAL EXCHANGE MECHANISM

BACKGROUND OF THE INVENTION

1. Field of the Invention

The present invention relates in general to the field of fuel cells and thermal exchange devices, alternatively known as heat sinks and, more particularly, to a fluid-permeable heat sink that is integrated with a byproduct of the fuel cell to cool a component or components thermally coupled to the heat sink.

2. Description of the Related Art

The following descriptions and examples are not admitted to be prior art by virtue of their inclusion within this section.

It is generally known that fuel cell technology provides a source of electric power. Fuel cells are electrochemical devices that convert the chemical energy of a reaction into electrical energy. The basic physical structure or building block of a fuel cell consists of an electrolyte layer in contact with a porous anode and cathode on either side of the electrolyte.

In a typical fuel cell, gaseous fuels are fed continuously to the anode and an oxidant, such as oxygen from air, is fed continuously to the cathode. The electrochemical reaction takes place at the electrodes to produce an electric current caused by ion conduction flow between the anode and cathode.

Although having components and characteristics similar to those of a typical battery, a fuel cell differs in several respects. A battery is an energy storage device and will cease to produce electrical energy when the battery is discharged. A fuel cell, on the other hand, is an energy conversion device that has the capability to produce electrical energy for as long as the fuel and oxidant are supplied to the electrodes.

The ion conduction flow results from the fuel and oxidant gases flowing past the surfaces of the anode or cathode, opposite the electrolyte at the other surface of the anode and cathode. The fuel, oftentimes hydrogen, reacts with the oxidant to form a water byproduct. Hydrogen, however, is not the only type of fuel used in fuel cells. Any fuel that can be burned galvanically at the anode and any oxidant that can be reduced at a sufficient rate encompasses all the various types of fuels and oxidants used in fuel cells. Gaseous hydrogen and oxygen has become the fuel of choice for most applications since it is readily available and economical. Moreover, use of hydrogen and oxygen gases produce a byproduct of water. Water is both stable and easily disposed.

The efficiency of a fuel cell is dictated primarily by the amount of electrolyte between the electrodes, and the porosity of the electrodes. If the electrolyte becomes to plentiful, the electrode (even though it is usually very porous) may "flood" and restrict the transport of the gaseous species and the transfer of the ions across the electrolyte. In an effort to control the problems of flooding, the fuel cells are typically monitored and the temperature of operation is carefully controlled. For example, the electrolytes can either be solid or aqueous. If aqueous electrolytes are used, the temperatures must be limited to approximately 200° C. or lower in order to achieve a proper vapor pressure and to reduce degradation that would occur if vapor were to exist as a byproduct transport medium. To minimize flooding, temperatures of the fuel cell are oftentimes lowered using various coolant devices.

As set forth in U.S. Pat. No. 4,826,741 (herein incorporated by reference), cell flooding and electrolyte membrane dehydration can be reduced if direct air cooling or liquid cooling is applied to the fuel cell itself. For example, a thermal exchange device, such as a heat sink, can be thermally attached to the fuel cell. Air is forced to flow across the fins of the heat sink to cool the fuel cell and prevent the water byproduct of a hydrogen-fed fuel cell from flooding at the electrode surfaces.

Details of thermal exchange devices, such as a heat sink, are readily available in the industry. For example, U.S. Pat. No. 6,841,250 describes one form of heat sink, with fins extending a spaced distance from each other through which air is forced to travel. The surfaces of a typical heat sink are solid and non-porous. Once the air strikes the non-porous surface, the thermally conductive, solid surface (typically thermally conductive metal) is cooled, and the cooling effect is transferred throughout the heat sink attached to the fuel cell.

While utilizing a heat sink to cool a fuel cell beneficially improves the performance of the fuel cell, the improvement is nonetheless limited to fuel cell operation. It would be desirable to implement the benefits of cooling a fuel cell while also cooling yet another heat source altogether different from a fuel cell. It would be further beneficial to utilize the byproduct of a fuel cell as the cooling medium of a heat source, regardless of whether the heat source is a fuel cell, electronic component, or both. By deriving an improved mechanism of having a porous heat sink evaporatively cool a heat sink, water therein not only provides a benefit beyond the conventional art, but also does so in a convenient manner in which cooling takes place with an already existing water supply.

SUMMARY OF THE INVENTION

The problems outlined above are in large part solved by an improved system of transferring thermal energy from both a fuel cell and a heat source. The heat source can be an electronic component such as, for example, a packaged integrated circuit or circuits. The fuel cell preferably consumes a hydrogen and oxygen gas and produces a water byproduct that is transported along a wick from the fuel cell to a cooling destination. The cooling destination can comprise a heat sink having an enclosure that surrounds the fluid at the destination. The enclosure preferably includes a fluid-permeable external wall that is configured to allow the enclosure to cool when the fluid permeates the external wall. The enclosure of the heat sink can be thermally secured to the fuel cell, the heat source, or both. By utilizing a fluid-permeable external wall, at least a portion of the fluid, preferably water, undergoes a phase change at some time during or after permeating the external wall. By undergoing a phase change, the evaporative cooling is much more efficient than simply passing air across a solid (non-permeable) external wall. Liquid water absorbs approximately 1 cal/g when being heated by 1° C., whereas air absorbs only 0.25 cal/g when being heated by 1° C. Thus, the degree of cooling of a fluid-permeable external surface can be approximately four times that of a non-permeable surface.

According to one embodiment, a thermal transfer system is provided comprising a fuel cell, a wick, and an enclosure that surrounds the fluid at the destination of the wick. According to another embodiment, a heat sink is provided. The heat sink preferably includes a base and at least one member extending from the base, and having a fluid-permeable external wall. The base can be secured to any heat source and the fluid-permeable external wall is configured to allow a fluid to undergo a phase change when the fluid permeates the wall and is evaporatively discharged from that surface. According to yet another embodiment, a method is provided for transferring thermal energy. The method includes generating a fluid, transporting the fluid to a heat sink, and forwarding at least a portion of the fluid through a wall of the heat sink to expose the fluid to air.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
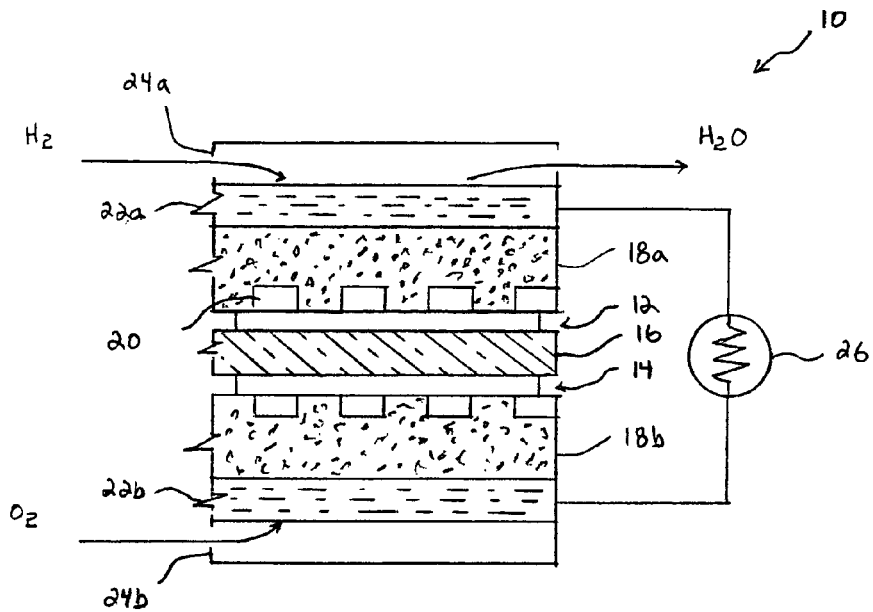
FIG. 1 is a partial, side cross-sectional view of one example of a fuel cell having a pair of fuel electrodes, an ion exchange membrane, reactant distribution channels, and a fluid-permeable cathode and anode to which a load is coupled.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 illustrates one form of a fuel cell 10. It is understood that there are numerous forms of fuel cells with different layouts, different structures, and different numbers and sizes of layers, depending on the fuel cell application. Regardless of the differences in fuel cell types, applications, layouts, and structures, it is contemplated that any electrochemical device that converts chemical energy of a reaction to an electrical energy is henceforth referred to as a fuel cell. The example shown in FIG. 1 is that of only one type of fuel cell having a plurality of layers, including a fuel electrode (anode) 12 to which fuel is fed. It is understood, however, that the term "fuel cell" used herein contemplates all types of fuel cell configurations, layouts, structures and electrochemical reactions necessary to generate electrical energy from chemical energy.

An oxidant electrode (cathode) 14 allows oxygen-containing gas to be fed. An ion exchange membrane 16 is configured between and in contact with anode 12 and cathode 14. Membrane 16 contains the electrolyte through which ions conduct between the anode and cathode. The layers of fuel cell 10 further includes an electrically conductive reactant distribution plates 18a and 18b. Plates 18a and 18b contact the fuel electrode 12 and the oxidant electrode 14 over substantially their entire area. Plates 18 are of porous material that may have grooves 20 confronting its adjacent electrode.

Fuel cell 10 may further have a fluid-permeable electrically conductive members 22a and 22b. Members 22a and 22b contact with the porous reactant distribution plate, and provide means for storing and transporting water to and from the fuel cell. Reactant distribution channels 24a and 24b provide a conduit in which the fuel, such as gaseous hydrogen, is transported through the fluid-permeable electrical conductor and onto the fuel electrode 12. Likewise, the oxidant, such as gaseous oxygen, can be forwarded through channel 24b, through the fluid-permeable conductor 22b, and then onto the oxidant electrode 14. Water byproduct can thereafter be transferred from either one or both of the channels 24a and 24b outward to a transport mechanism described herein below. The fluid-permeable electrical conductors 22a and 22b have means for connecting wires or conductive cables to a load 26. The electrical load will draw the electric current sent between conductors 22a and 22b as the ion flows across electrolyte 16.

Fuel cell 10 can be replicated where cells are stacked on each other, similar to a series of batteries connected to one another. The load can then be connected between the first cell and possibly the Nth cell of the stack to increase the amount of current supplied to the load. For sake of brevity, only one cell is shown; however, it is understood that the term "fuel cell" contemplates one or more fuel cells stacked on each other depending on the application and the loading requirements.

Figure 2:
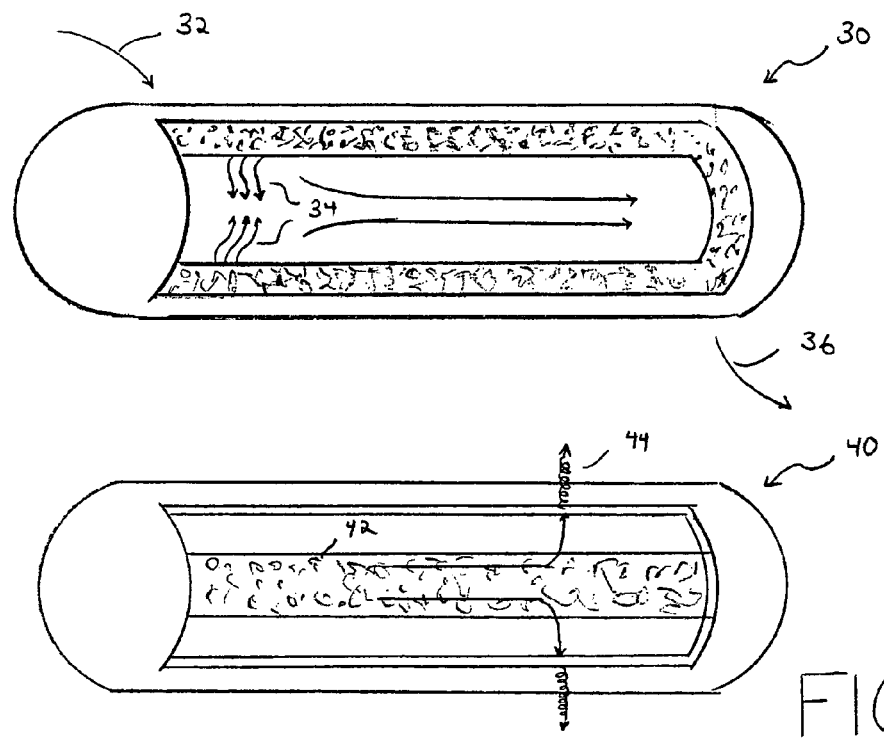
FIG. 2 is a partial cut-away view of a heat pipe with solid external walls that utilizes a change in phase between a liquid and gas to transfer heat, and a fluid distribution pipe with porous external walls to evaporatively cool fluid transferred within the fluid distribution pipe.

FIG. 2 illustrates the differences between a heat pipe 30 and a wicking pipe 40. A heat pipe is a device that transfers heat from one point to another. A typical heat pipe consists of a sealed and non-porous enclosure or container whose inner surface has a relatively high surface tension to receive heat at a particular spot 32, with other spots relatively much cooler. This will tend to set up a large temperature gradient and cause flow instabilities in the production of a vapor from the liquid contained in the heat pipe. Vaporization 34 will occur at spot 32. Due to the temperature differences, the fluid flow of the vapor will travel to the cooler regions of the heat pipe, where the vapor coalesces on the inner surface of the heat pipe capillary material, wetting all internal surfaces. In other words, applying heat at point 32 will cause the liquid to boil and enter a vapor state at that site region. When this happens, the liquid picks up latent heat of vaporization. The gas, which then has a higher pressure, moves inside the sealed container to a colder location where it condenses. Thus, the gas gives up the latent heat at, for example, point 36, and moves heat from the input 32 to the output 36 of the heat pipe 30. Heat pipes must require a non-porous external surface in order to effectively transfer the heated gas from one end of the pipe to the other.

A wicking pipe 40 can contain a porous external surface. A wicking member 42 is placed along the center radial axis of pipe 40. Wick 42 draws the liquid from, for example, the outlet of a fuel cell 10 (FIG. 1) along the wick from one region to another. Depending on the temperature of the fluid, certain vapors may exist within pipe 40. Those vapors are allowed to permeate the fluid-permeable external wall, as shown by reference numeral 44. Thus, while pipe 40 can be porous (or non-porous if desired), it nonetheless is fundamentally different from pipe 30 which must be non-porous.

In whatever form, the fluid byproduct, preferably water, is drawn from one region of the fuel cell to a cooling region. If the pipe is porous, then the cooling region can be throughout the length of the pipe. However, if the pipe is integrated into, for example, one or more fins of a heat sink 50 (FIG. 3), then cooling can also occur along the fluid-permeable external walls of the heat sink 50, described herein below. Alternatively, the pipe can be non-porous, and simply transfer both water and heat, similar to pipe 30. Thus, the term "pipe" used herein contemplates both types of pipes 30 and 40, shown in FIG. 2. If the pipe is a heat pipe then, similar to the wicking pipe, water must be transported in the pipe in order to effectuate evaporative cooling at the heat sink destination.

Figure 3:
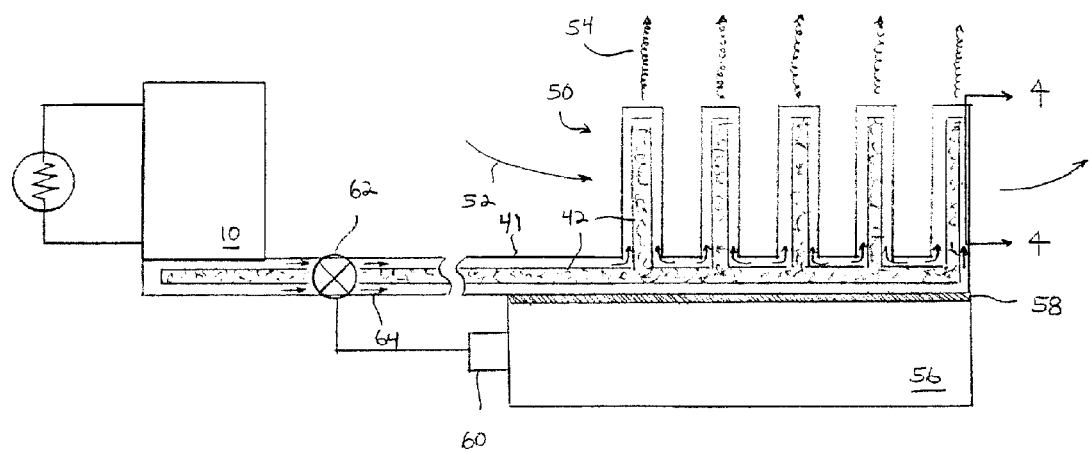
FIG. 3 is a side plan view of a fuel cell having a fluid byproduct received within a fluid distribution pipe that transfers the fluid to a porous heat sink to evaporatively cool a component thermally coupled to the heat sink.

FIG. 3 illustrates a heat sink 50 integrated with a fluid transport pipe 41 (i.e., pipe 30 or pipe 40 of FIG. 2) for transferring water byproduct, for example, from fuel cell 10. The water byproduct is drawn along a wick 42 that is shown in FIG. 3 as extending not only within pipe 41, but also within at least one fin of heat sink 50. Preferably, wick 42 extends within each and every one of the fins, and also preferably extends the entire length of those fins. Wick 42 is shown near the center radial region of pipe 41 and each fin of heat sink 50. It is understood that wick 42 can be offset from the center radial region or can consume to entire radial region with no spacing between the wick and the inside walls of pipe 41 and heat sink 50. The fluid-permeable heat sink 50 and/or the fluid-permeable external wall of pipe 41 allow fluid, such as water, to escape to the external air 52 that is forced across the external surface to cause an evaporation 54 of the fluid that passes through the surface.

The heat sink 50 and/or pipe 41 can be secured to a heat source 56. One exemplary method of securing is through a thermally conductive adhesive 58. There are numerous type of such adhesives on the market. As shown, thermally coupled to heat source 56 is a thermister 60 that takes temperature readings from source 56, and conveys those readings as an electrical signal to, for example, a valve 62. As the temperature increases from heat source 56, thermister 60 increases the magnitude of the current and/or voltage applied to valve 62. As the magnitude increases, the valve will increase its opening to cause more fluid 64 to pass. Thus, thermister 60 and valve 62 provide a feedback to allow self regulation of the temperature buildup upon and/or within heat source 56.

It is not critical, however, that thermal readings be taken and a valve be used to increase or decrease fluid flow. Typically, as the heat source temperature increases, the amount of evaporation 54 will increase and, thus, the cooling effect will increase. Therefore, even without a valve or feedback mechanism, the evaporative process provides a linear and self-regulating cooling effect as the temperature at the heat source increases.

Figure 4:
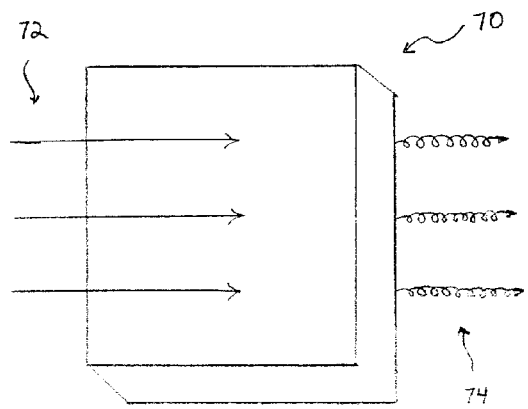
FIG. 4 is a side perspective view of a fluid permeable external wall of the integrated fluid distribution pipe and heat sink along plane 4 of FIG. 3.

FIG. 4 illustrates a fluid-permeable external wall 70 along plane 4 of FIG. 3. While shown as an external wall of heat sink 50, it is understood that wall 70 can also be the external wall of pipe 40. As shown, fluid, such as water from the fuel cell, is transported across the inner surface of wall 70 as shown by arrows 72. Transport efficiencies may be enhanced using the wick 42 (FIG. 3). The primary heat transfer mechanism occurs in the region where the fluid 72 is contained by porous surface adhesion at the inside surface of wall 70. The porous surface allows water to permeate the internal surface to the external surface of wall 70, and thereby undergo a phase change as the water on the external surface changes to vapor, and is removed from the heat exchange surface through convection or forced air flow. The vapor is shown released from the external surface by arrows 74.

Heat transfer efficiency is increased when compared to traditional heat transfer systems because phase transition of the fluid absorbs more energy, and heated vapor contains more latent heat than simply air alone. External wall 70 thereby suffices as a fluid barrier, but allows certain amounts of fluid to permeate the wall so that the fluid, which does permeate the wall, can undergo a phase change for maximum cooling. The material chosen to allow fluid permeation or to allow condensation on the external surface can include, for example, certain ceramic materials or microfiber polymer fabrics (e.g., Gortex®), and various other substances known to those skilled in the art having the benefit of this disclosure.

External wall 70 can be placed next to any heat source or multiple heat sources. Using a porous external wall exploits the energy absorption of the phase change of water from liquid to vapor, and also exploits the latent heat capacity and gaseous nature of water vapor to transport heat from the heat source. It may be desirable to selectively control the flow of water, as shown in FIG. 3 via a valve. Only at times when maximum cooling is needed, the water cooling can be applied by opening the valve to cool the heat source. From a practical standpoint, if the heat source is, for example, a microprocessor, selectively cooling the microprocessor would avoid having to throttle the cycle clock on the microprocessor during times of substantial heat generation. This will enhance the efficiency of the microprocessor while maintaining maximum cycle time (throughput), yet selectively cooling whenever the microprocessor reaches a certain temperature. Whenever the microprocessor is below the threshold temperature, water need not be drawn from the fuel cell to the heat sink.

At typical atmospheric pressure, liquid water has been shown to absorb between 540-597 cal/g of water evaporated. Liquid water absorbs 1 cal/g when being heated by 1° C. Air absorbs only 0.25 cal/g when being heated by 1° C. Thus, both the heating of water and the subsequent vaporization of water will remove almost four times the heat from the system than the convection or air flow of air along.

Figure 5:
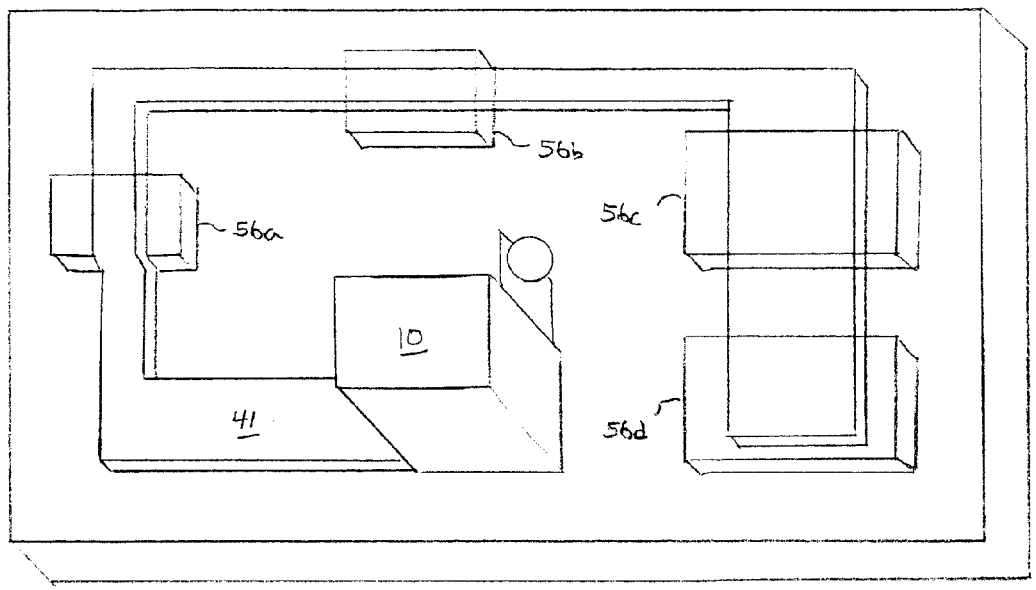
FIG. 5 is a top, perspective view of a fuel cell fluid-coupled to the integrated fluid distribution pipe and heat sink to cool one or more components according to one embodiment.

FIG. 5 illustrates a fuel cell 10 and a fluid transport mechanism or pipe 41 leading from fuel cell 10 to various heat sources 56a, 56b, 56c, and 56d. In addition to heat sources 56, fuel cell 10 can also be a heat source. The fluid transport pipe 41 can have a fluid-permeable external surface, and need not necessarily further include a heat sink having a plurality of fins rising up from a base unit that is connected to pipe 41. Thus, pipe 41 can effectively operate as a heat sink by simply wicking the transport of fluid from one region of the pipe to another region, and cooling various regions near a heat source using a fluid change of phase and associated evaporative cooling.

The heat sources 56 can be an electronic system, such as various components of a notebook computer, tablet computer, desktop computer, computers in general, personal digital assistant (PDA), electronic camera, cellular phone, cordless phone, video camera, stereo equipment, MP3 player, consumer electronics, portable electronics, microelectronics, television, flat panel display, network equipment, electronic systems, wireless devices, embedded electronics, integrated circuits, and so forth, all of which are generally referred to as an electronic system which generates heat through operation.

Figure 6:
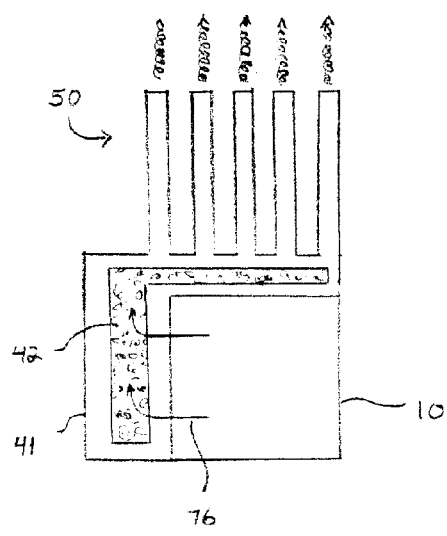
FIG. 6 is a side, plan view of a fuel cell fluid-coupled to the integrated fluid distribution pipe and heat sink to cool the fuel cell according to another embodiment.

FIG. 6 illustrates the heat source being a fuel cell 10 shown as a side, plan view. Fuel cell 10 generates heat as well as a fluid byproduct that flows from fuel cell 10 to a water transport conduit or pipe 41 having a wick 42 arranged superadjacent fuel cell 10. Fluid is transported along arrows 76 via wick 42 to, for example, a heat sink 50. The pipe 41, wick 42, and heat sink 50 are shown coupled only to fuel cell 10 for cooling fuel cell 10 to an optimal operating temperature (e.g., less than 200° C.). By cooling the fuel cell, flooding is minimized and the ion exchange membrane avoids excessive dehydration. Both flooding and dehydration can negatively impact the efficiency of the fuel cell electrical production.

It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A thermal transfer system, comprising:
    a fuel cell configured to produce a fluid;
    a wick configured to transfer the fluid to a destination; and
    an enclosure that surrounds the fluid at the destination having a fluid-permeable external wall that is configured to allow the enclosure to cool when the fluid permeates the external wall, wherein at least a portion of the fluid undergoes a phase change during or after permeating the external wall.

2. The thermal transfer system as recited in claim 1, wherein the fluid comprises water.

3. The thermal transfer system as recited in claim 1, wherein the wick is configured along an elongated axis of a pipe approximately near a center of a cross-section of the pipe.

4. The thermal transfer system as recited in claim 3, wherein the pipe comprises a fluid-permeable pipe wall that surrounds the wick and is in contact with the fluid.

5. The thermal transfer system as recited in claim 1, wherein the wick is configured at least partially within a byproduct output channel of the fuel cell.

6. The thermal transfer system as recited in claim 1, wherein the wick is configured at least partially within the enclosure.

7. The thermal transfer system as recited in claim 1, wherein the enclosure comprises a pair of external walls that form one fin of the enclosure separated by another pair of external walls that form another fin.

8. The thermal transfer system as recited in claim 1, wherein the enclosure is secured to the fuel cell.

9. The thermal transfer system as recited in claim 1, wherein the enclosure is secured to a heat source component.

10. A method for transferring thermal energy, comprising:
    generating a fluid by reacting gaseous fuel to produce the fluid as a byproduct of electric current generation;
    transferring the fluid to a heat sink; and
    forwarding at least a portion of the fluid through a wall of the heat sink to expose the fluid to air, and evaporating at least a portion of the fluid exposed to air and concurrently transferring thermal energy from the heat sink.

11. The method as recited in claim 10, wherein said transferring comprises wicking the fluid along a pipe.

* * * * *